(12) United States Patent
Kim

(10) Patent No.: US 11,877,471 B2
(45) Date of Patent: Jan. 16, 2024

(54) DISPLAY APPARATUS AND METHOD OF MANUFACTURING THE SAME

(71) Applicant: Samsung Display Co., Ltd., Yongin-Si (KR)

(72) Inventor: Hun Kim, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 316 days.

(21) Appl. No.: 17/476,391

(22) Filed: Sep. 15, 2021

(65) Prior Publication Data

US 2022/0263045 A1   Aug. 18, 2022

(30) Foreign Application Priority Data

Feb. 16, 2021 (KR) .................. 10-2021-0020685

(51) Int. Cl.
| | |
|---|---|
| H10K 50/844 | (2023.01) |
| H10K 71/00 | (2023.01) |
| H10K 59/131 | (2023.01) |
| H10K 77/10 | (2023.01) |
| H10K 59/12 | (2023.01) |
| H10K 102/10 | (2023.01) |
| H10K 102/00 | (2023.01) |

(52) U.S. Cl.
CPC ......... *H10K 50/844* (2023.02); *H10K 59/131* (2023.02); *H10K 71/00* (2023.02); *H10K 77/111* (2023.02); *H10K 59/1201* (2023.02); *H10K 2102/102* (2023.02); *H10K 2102/311* (2023.02)

(58) Field of Classification Search
CPC .... H10K 50/844; H10K 59/131; H10K 71/00; H10K 77/111; H10K 59/1201; H10K 2102/102; H10K 2102/311; H10K 50/8445; H10K 59/12; H10K 71/50; H01L 27/156
See application file for complete search history.

(56) References Cited

U.S. PATENT DOCUMENTS

| | | |
|---|---|---|
| 7,829,147 B2 | 11/2010 | Aitken et al. |
| 8,115,326 B2 | 2/2012 | Aitken et al. |
| 2003/0174275 A1* | 9/2003 | Asano ............... H01L 27/1214 257/E21.414 |
| 2020/0006682 A1 | 1/2020 | Seo et al. |

FOREIGN PATENT DOCUMENTS

| | | |
|---|---|---|
| KR | 10-1589313 B1 | 1/2016 |
| KR | 10-2020-0003326 A | 1/2020 |
| KR | 10-2139677 B1 | 7/2020 |

* cited by examiner

*Primary Examiner* — Kyoung Lee
(74) *Attorney, Agent, or Firm* — Innovation Counsel LLP

(57) ABSTRACT

A display apparatus includes a first substrate, a second substrate, and a transistor. The first transistor includes a polymer resin. The second substrate is arranged between the first substrate and the transistor and includes a glass material. A liquidus temperature of the glass material is less than 1000° C. The transistor overlaps at least one of the first substrate and the second substrate and includes a semiconductor layer.

20 Claims, 12 Drawing Sheets

DISPLAY APPARATUS AND METHOD OF MANUFACTURING THE SAME

CROSS-REFERENCE TO RELATED APPLICATION(S)

This application claims priority under 35 U.S.C. § 119 to Korean Patent Application No. 10-2021-0020685, filed on Feb. 16, 2021, in the Korean Intellectual Property Office; the Korean Patent Application is incorporated by reference herein in its entirety.

BACKGROUND

1. Field

The technical field relates to a display apparatus and a method of manufacturing the display apparatus.

2. Description of the Related Art

Display apparatuses display images according to input signals and have various applications. Among display apparatuses, flexible display apparatuses are foldable and/or rollable and thus provide excellent portability and/or excellent impact resistance.

SUMMARY

In a display apparatus, such as a flexible display apparatus, a substrate may include a polymer resin. It is desirable to prevent or minimize dipoles at an interface of the substrate (e.g., an interface between the substrate and a barrier layer), for preventing or minimizing changes in characteristics of a transistor of the display apparatus.

According to one or more embodiments, a display apparatus includes the following elements: a first substrate including a polymer resin, a second substrate arranged on the first substrate and including a low liquidus temperature (LLT) material, and a transistor arranged on the second substrate and including a semiconductor layer.

The second substrate may include an inorganic oxide.

The second substrate may include a tin oxide including the LLT material.

The second substrate may include at least one of tin (Sn), boron (B), phosphorus (P), and fluorine (F).

The display apparatus may further include a display element arranged on the transistor.

The display apparatus may further include an encapsulation member arranged on the display element.

The encapsulation member may include at least one inorganic layer and at least one organic layer.

The display apparatus may further include a first barrier layer between the first substrate and the second substrate.

The display apparatus may further include a buffer layer between the second substrate and the transistor, and the semiconductor layer may be arranged directly on the buffer layer.

The display apparatus may further include a second barrier layer between the second substrate and the buffer layer.

According to one or more embodiments, a method of manufacturing a display apparatus includes the following steps: forming, on a first substrate, a second substrate including a low liquidus temperature (LLT) material, and forming, on the second substrate, a transistor including a semiconductor layer.

The first substrate may include a polymer resin.

The second substrate may include an inorganic oxide.

The second substrate may include a tin oxide including an LLT material.

The second substrate may include at least one of tin (Sn), boron (B), phosphorus (P), and fluorine (F).

The method may further include forming a display element on the transistor.

The method may further include forming an encapsulation member on the display element.

The encapsulation member may include at least one inorganic layer and at least one organic layer.

The method may further include, before the forming of the second substrate on the first substrate, forming a first barrier layer on the first substrate.

The method may further include, before the forming of the transistor on the second substrate, forming a second barrier layer on the second substrate.

An embodiment may be related to a display apparatus. The display apparatus may include a first substrate, a second substrate, and a transistor. The first substrate may include a polymer resin. The transistor may overlap the first substrate. The second substrate may be arranged between the first substrate and the transistor and may include a glass material. A liquidus temperature of the glass material may be less than 1000° C.

The second substrate may be formed of an inorganic oxide.

The second substrate is formed of a tin oxide that is doped with the glass material.

An embodiment may be related to a method for manufacturing a display apparatus. The method may include the following steps: preparing a first substrate; forming a second substrate on the first substrate, wherein the second substrate may include a glass material, and wherein a liquidus temperature of the glass material may be less than 1000° C.; and forming a transistor on the second substrate, wherein the transistor may include a semiconductor layer and may overlap the first substrate, and wherein the second substrate may be positioned between the first substrate and the transistor.

DETAILED DESCRIPTION

Figure 1:
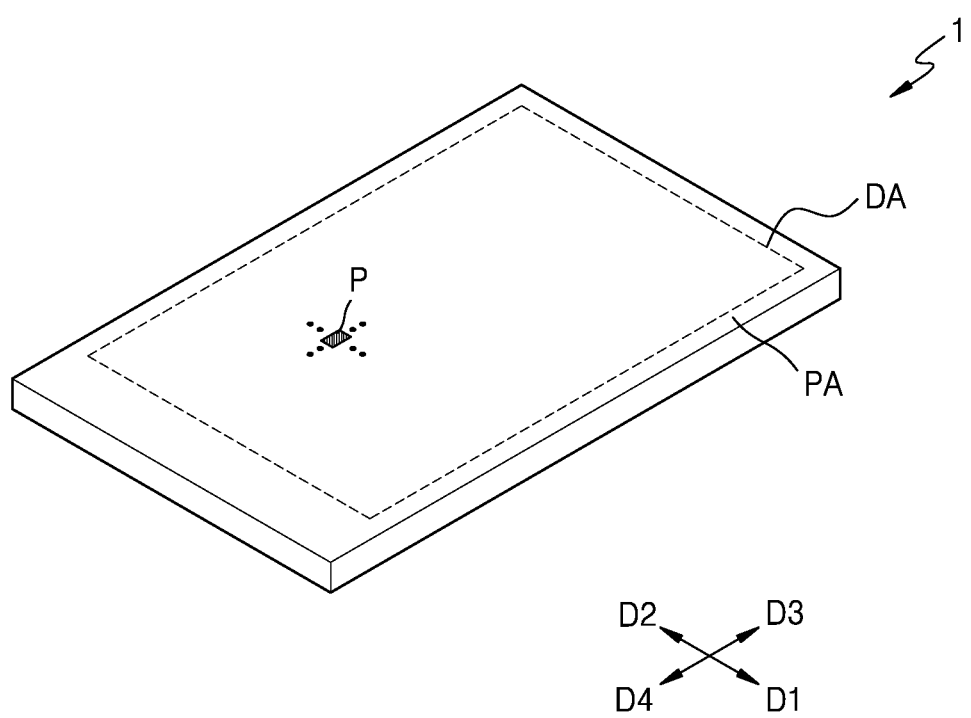
FIG. 1 is a schematic perspective view of a display apparatus according to an embodiment.

Example embodiments are described with reference to the accompanying drawings, wherein like reference numerals may refer to like elements. The example embodiments may have different forms and should not be construed as being limited to the description.

Although the terms "first," "second," etc. may be used to describe various elements, these elements should not be limited by these terms. These terms are used to distinguish one element from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms may include the plural forms unless the context clearly indicates otherwise.

The terms "include," "comprise," and "have" specify the presence of stated features or elements but may not preclude the addition of one or more other features or elements.

When a first element is referred to as being "=on" a second element, the first element can be directly or indirectly on the second element. No intervening elements or one or more intervening elements may be present between the first element and the second element.

Dimensions in the drawings may be exaggerated or reduced for convenience of explanation.

The expression that an element "extends in a first direction" may mean that the lengthwise direction of the element is (in) the first direction. The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be formed of" or "be made of."

FIG. 1 is a schematic perspective view of a display apparatus 1 according to an embodiment.

Referring to FIG. 1, the display apparatus 1 may include a display area DA and a peripheral area PA arranged around the display area DA. The peripheral area PA may at least partially surround the display area DA. The display apparatus 1 may provide an image using light emitted from pixels P arranged in the display area DA. No pixels P may be arranged in the peripheral area PA. The peripheral area PA may be a non-display area where no image is displayed according to input signals.

The display apparatus 1 may be an organic light-emitting display apparatus, an inorganic light-emitting display apparatus, an inorganic electroluminescent (EL) display apparatus, or a quantum dot light-emitting display apparatus. An emission layer of a display element of the display apparatus 1 may include an organic material, an inorganic material, quantum dots, an organic material with quantum dots, or an inorganic material with quantum dots.

The display apparatus 1 may include a flat display surface, a stereoscopic display surface, and/or a curved display surface. The display apparatus 1 may be flexible, foldable, bendable, and/or rollable.

When the display apparatus 1 includes a stereoscopic display surface, the display apparatus 1 includes a plurality of display areas facing different directions. The display apparatus may include a polygonal and/or columnar display surface. The display apparatus 1 may include a curved display surface.

The display apparatus 1 may be applicable to a mobile phone terminal. Although not shown, an electronic module, a camera module, a power module, and the like mounted on a mainboard may be arranged together with the display apparatus 1 in a bracket/case, etc. of the mobile phone terminal. The display apparatus 1 may be applicable to large-sized electronic devices (such as televisions and monitors) and/or small and medium-sized electronic devices (such as tablet personal computers, vehicle navigation systems, game consoles, and smart watches).

The display area DA of the display apparatus 1 may have one or more shapes, such as at least one of a quadrilateral, a circle, an oval, a triangle, and a pentagon.

The display apparatus 1 may include the pixels P arranged in the display area DA. Each of the pixels P may include an organic light-emitting diode (OLED). Each of the pixels P may emit red, green, blue, or white light, through the OLED.

Figure 2:
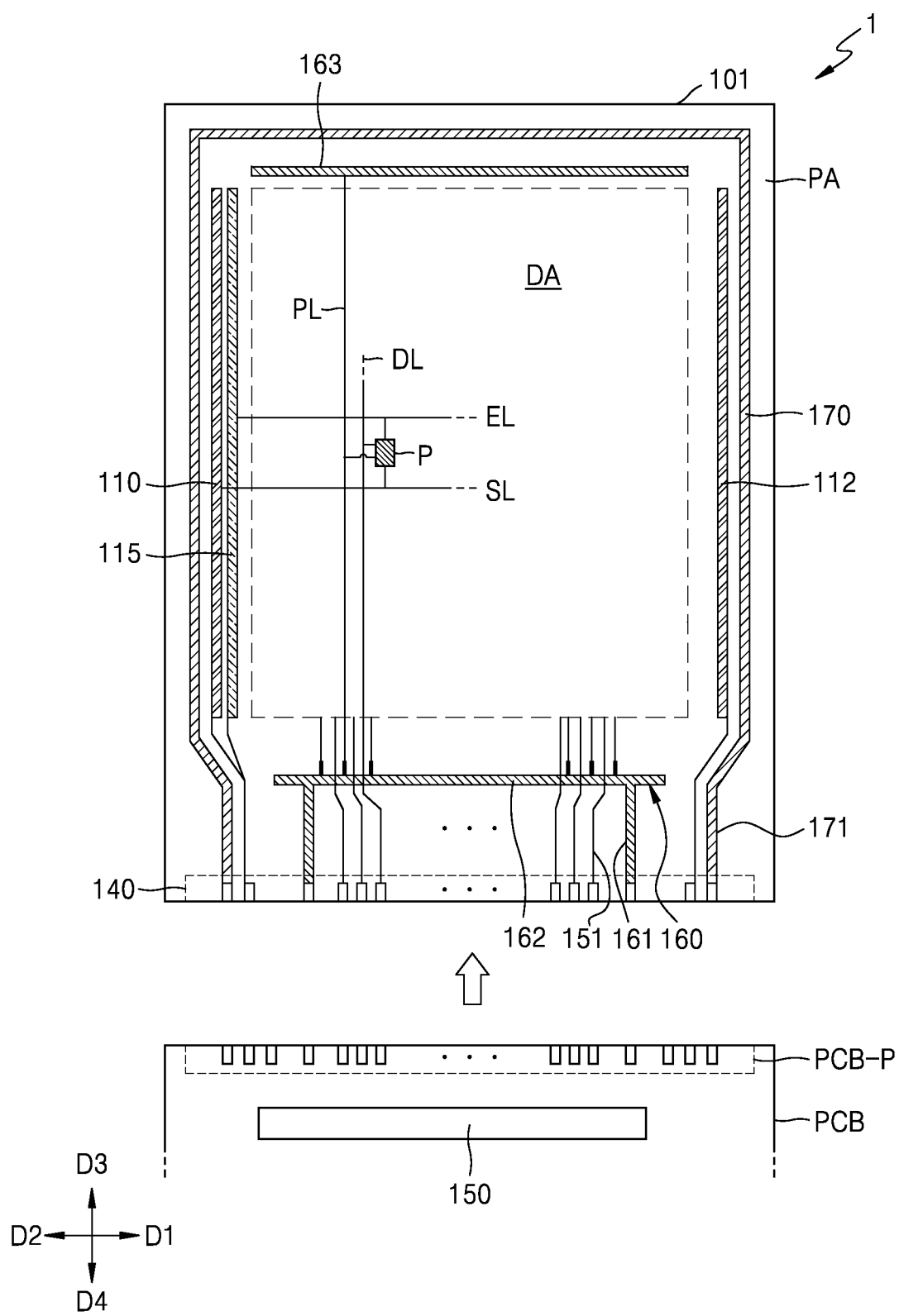
FIG. 2 is a schematic plan view of a display apparatus according to an embodiment.

FIG. 2 is a schematic plan view of a display apparatus 1 according to an embodiment. In FIG. 2, a first direction D1 and a second direction D2 may indicate opposite directions. For example, the first direction D1 may be a right direction, and the second direction D2 may be a left direction. A third direction D3 and a fourth direction D4 may indicate opposite directions. For example, the third direction D3 may be an upward direction, and the fourth direction D4 may be a downward direction. The first direction D1 and the third direction D3 may be perpendicular to each other.

Referring to FIG. 2, elements included in the display apparatus 1 may be arranged over a first substrate 101. The display apparatus 1 may include the pixels P arranged in the display area DA. Each pixel P may be electrically connected to outer circuits arranged in the peripheral area PA. A driving circuit (for driving the pixels P) and/or wires may be arranged in the peripheral area PA. For example, a first scan driving circuit 110, a second scan driving circuit 112, a first emission driving circuit 115, a terminal 140 (or terminal set 140), a data driving circuit 150, a first power supply line 160, and a second power supply line 170 may be arranged in the peripheral area PA.

The first scan driving circuit 110 may provide scan signals to pixels P through scan lines SL. The second scan driving circuit 112 may be parallel to the first scan driving circuit 110. The display area DA may be positioned between the scan driving circuits 110 and 112.

Some of the pixels P may be electrically connected to the first scan driving circuit 110, and the others thereof may be electrically connected to the second scan driving circuit 112. The second scan driving circuit 112 may be optional, and all the pixels P may be electrically connected to the first scan driving circuit 110.

The first emission driving circuit 115 may provide emission control signals to pixel P through emission control lines EL. The first emission driving circuit 115 may be spaced apart from the first scan driving circuit 110 in the first direction D1 and arranged on the peripheral area PA. The first scan driving circuit 110 and the first emission driving circuit 115 may be arranged in the third direction D3 or the fourth direction D4. One or more first emission driving circuits 115 may be between first scan driving circuits 110, and/or one or more first scan driving circuits 110 may be between first emission driving circuits 115.

The terminal 140 may be arranged on one side of the first substrate 101. The terminal 140 may be electrically connected to a printed circuit board PCB. A terminal PCB-P (or terminal set PCB-P) of the printed circuit board PCB may be electrically connected to the terminal 140. The printed circuit board PCB may transmit signals or power provided by a controller (not shown) to the display apparatus 1. Control signals generated by the controller may be transmitted to the first scan driving circuit 110, the second scan driving circuit 112, and the first emission driving circuit 115 through the printed circuit board PCB. The controller may provide a first power voltage ELVDD (a driving voltage) (see FIG. 3) and a second power voltage ELVSS (a common voltage) (see FIG. 3) to the first power supply line 160 and the second power supply line 170, respectively, through a first connection line 161 and a second connection line 171. The first power voltage ELVDD may be provided to each pixel P through a driving voltage line PL connected to the first power supply line 160, and the second power voltage ELVSS may be provided to an opposite electrode of each pixel P connected to the second power supply line 170.

The data driving circuit 150 may be electrically connected to data lines DL. Data signals provided by the data driving circuit 150 may be provided to the pixels P through connection lines 151 connected to the terminal 140 and the data lines DL connected to the connection lines 151.

The data driving circuit 150 may be arranged on the printed circuit board PCB and/or the first substrate 101. When the data driving circuit 150 is arranged on the first substrate 101, the data driving circuit 150 may be between the terminal 140 and the first power supply line 160.

The first power supply line 160 may include a first sub-wire 162 and a second sub-wire 163 that extend parallel to each other. The display area DA may be positioned between the sub-wires 162 and 163 in the third direction D3 and/or the fourth direction D4. The second power supply line 170 may partially surround the display area DA and may have an open loop structure.

Figure 3:
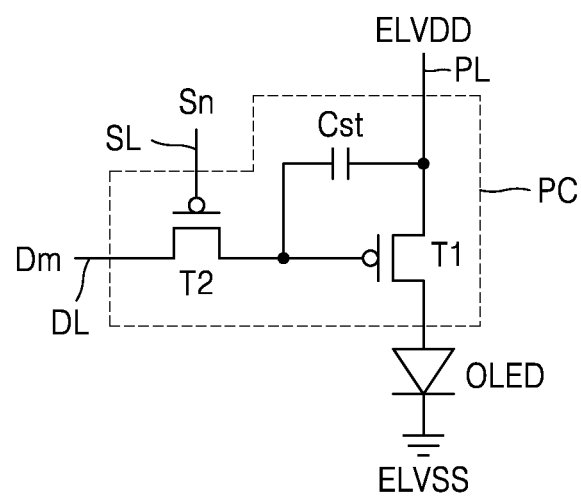
FIG. 3 is an equivalent circuit diagram of a pixel in a display apparatus according to an embodiment.

FIG. 3 is an equivalent circuit diagram of a pixel (P) in the display apparatus 1 according to an embodiment.

Referring to FIG. 3, the pixel may include a pixel circuit PC connected to a scan line SL and a data line DL, and may include an organic light-emitting diode OLED (as a display element) connected to the pixel circuit PC.

The pixel circuit PC may include a transistor and a storage capacitor. The pixel circuit PC may include a driving thin-film transistor (TFT) T1, a switching TFT T2, and a storage capacitor Cst.

The switching TFT T2 may be connected to the scan line SL and the data line DL and may transmit a data signal Dm input through the data line DL to the driving TFT T1 according to a scan signal Sn input through the scan line SL.

The storage capacitor Cst may be connected to the switching TFT T2 and a driving voltage line PL and may store a voltage corresponding to a difference between a voltage received from the switching TFT T2 and the first power voltage ELVDD supplied to the driving voltage line PL.

The driving TFT T1 may be connected to the driving voltage line PL and the storage capacitor Cst and may control a driving current flowing from the driving voltage line PL to the organic light-emitting diode OLED in response to a voltage value stored in the storage capacitor Cst. The organic light-emitting diode OLED may emit light having a certain luminance due to the driving current.

The pixel circuit PC may include three or more TFTs and/or two or more storage capacitors. The pixel circuit PC may include seven TFTs and one storage capacitor. The pixel circuit PC may include seven TFTs and two storage capacitors. Various modifications are possible in various embodiments.

Figure 4:
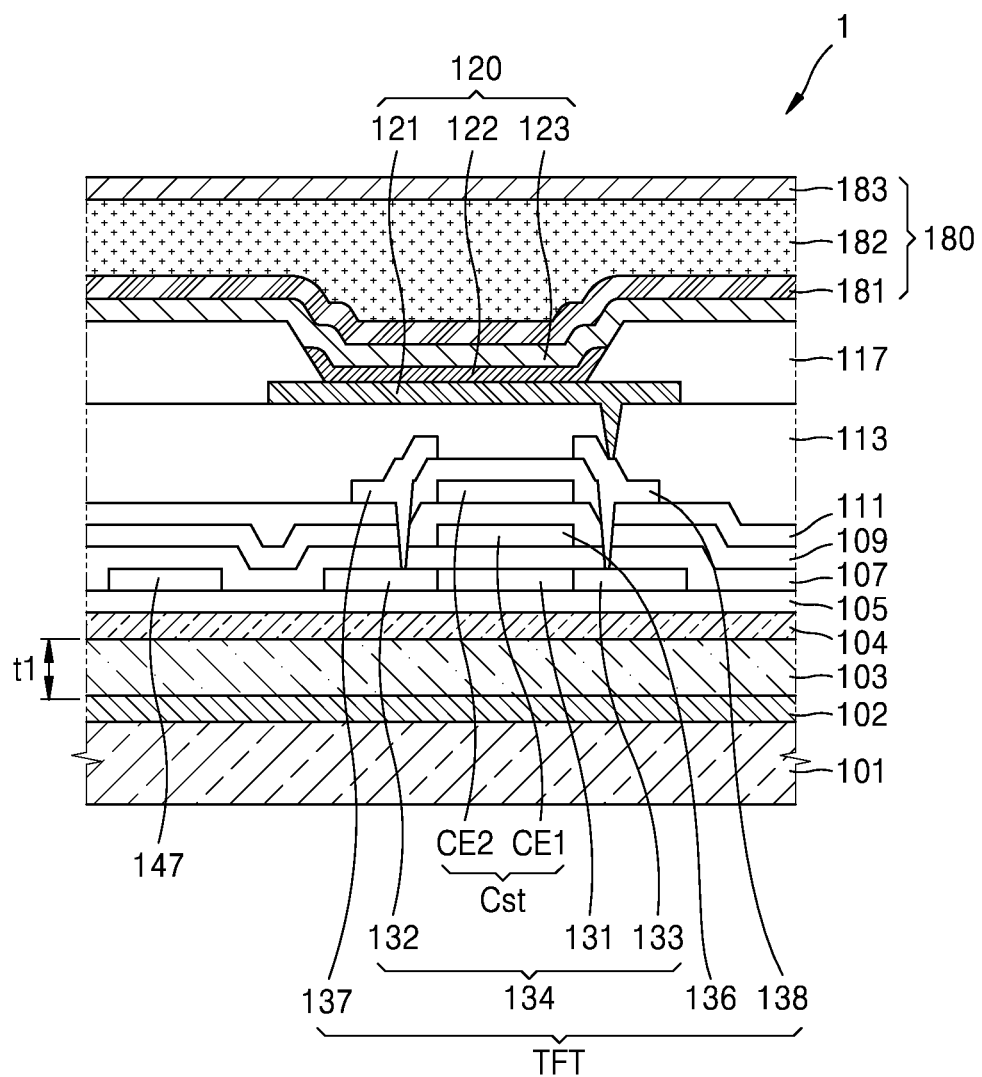
FIG. 4 is a schematic cross-sectional view of a display apparatus according to an embodiment.

FIG. 4 is a schematic cross-sectional view of a display apparatus 1 according to an embodiment.

Referring to FIG. 4, the display apparatus 1 may include the first substrate 101. Elements included in the display apparatus 1 may be arranged over the first substrate 101.

A first barrier layer 102 may be arranged on the first substrate 101. The first substrate 101 may include a polymer resin. The first substrate 101 may be flexible, rollable, and/or bendable. Accordingly, the display apparatus 1 may be flexible, rollable, and/or bendable.

The first substrate 101 may include a polymer resin such as polyethersulfone, polyacrylate, polyetherimide, polyethylene naphthalate, polyethylene terephthalate, polyphenylene sulfide, polyarylate, polycarbonate, or cellulose acetate propionate. The first substrate 101 may include polyimide. For example, the first substrate 101 may include transparent polyimide.

The first barrier layer 102 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

A second substrate 103 may be arranged on the first barrier layer 102. The second substrate 103 and the first substrate 101 may include the same material. For example, the second substrate 103 may include polyimide. The second substrate 103 may include a material different from that of the first substrate 101. For example, the second substrate 103 may include a low liquidus temperature (LLT) material. The second substrate 103 may include a tin oxide including (or doped with) an LLT material. The second substrate 103 may include an LLT material including (or doped with) tin.

A second barrier layer 104 may be arranged on the second substrate 103. The second barrier layer 104 and the first barrier layer 102 may include the same material. The second barrier layer 104 may include a material different from that of the first barrier layer 102.

The first barrier layer 102 may prevent or minimize damage to elements (e.g., a transistor) arranged on the first substrate 101 due to penetration of foreign matter, moisture, or external air through the first substrate 101. The second barrier layer 104 may prevent or minimize damage to elements (e.g., a transistor or a display element) arranged on the first substrate 101 due to penetration of foreign matter, moisture, or external air through the first substrate 101.

A buffer layer 105 may be arranged on the second barrier layer 104. The buffer layer 105 may overlap the first substrate 101 and the second substrate 103, may reduce or block foreign matter, moisture, or external air that penetrate through the first substrate 101 and the second substrate 103, and may provide a flat surface on the first substrate 101 and the second substrate 103. The buffer layer 105 may include an inorganic insulating material such as $SiO_2$, $SiN_x$, $SiO_xN_y$, $Al_2O_3$, $TiO_2$, $Ta_2O_5$, $HfO_2$, or ZnO.

A thin film transistor TFT including a semiconductor layer 134, a gate electrode 136, a source electrode 137, and a drain electrode 138 may be arranged on the buffer layer 105.

The semiconductor layer 134 may include an oxide semiconductor or a silicon semiconductor. When the semiconductor layer 134 includes an oxide semiconductor, the semiconductor layer 134 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may be InSnZnO (ITZO), InGaZnO (IGZO), or the like. When the semiconductor layer 134 includes a silicon semiconductor, the semiconductor layer 134 may include amorphous silicon (a-Si) or low temperature polysilicon (LTPS) obtained by crystallizing amorphous silicon (a-Si).

The semiconductor layer 134 may include a channel region 131 overlapping the gate electrode 136, and may include a source region 132 and a drain region 133 on opposite sides of the channel region 131. The source region 132 and the drain region 133 may include impurities having a concentration higher than that of the channel region 131. The impurities may include N-type impurities or P-type impurities. The source region 132 and the drain region 133 may be electrically connected to a source electrode 137 and a drain electrode 138. The source region 132 and the drain region 133 may function as the source electrode 137 and the drain electrode 138.

A first insulating layer 107 may be arranged on the semiconductor layer 134. The first insulating layer 107 may include an inorganic material including an oxide or a nitride. The first insulating layer 107 may include at least one of $SiO_2$, $SiN_X$, $SiO_XN_Y$, $Al_2O_3$, $TiO_2$, $Ta_2O_5$, $HfO_2$, and ZnO. The first insulating layer 107 may include a single layer or a multi-layer structure including an inorganic insulating material.

The gate electrode 136 may be arranged on the first insulating layer 107. The gate electrode 136 may include a single layer or a multi-layer structure including one or more of aluminum (Al), platinum (Pt), palladium (Pd), silver (Ag), magnesium (Mg), gold (Au), nickel (Ni), neodymium (Nd), iridium (Ir), Cr, lithium (Li), calcium (Ca), molybdenum (Mo), Ti, tungsten (W), and copper (Cu). The gate electrode 136 may be electrically connected to a gate wire (or scan line) configured to apply an electrical signal to the gate electrode 136.

A second insulating layer 109 may be arranged on the gate electrode 136. The second insulating layer 109 may include at least one inorganic insulating material, such as at least one of $SiO_2$, $SiN_X$, $SiO_XN_Y$, $Al_2O_3$, $TiO_2$, $Ta_2O_5$, $HfO_2$, and ZnO. The second insulating layer 109 may include a single layer or a multi-layer structure.

The storage capacitor Cst may be arranged on the first insulating layer 107. The storage capacitor Cst may include a first electrode CE1 and a second electrode CE2 overlapping the first electrode CE1. The first electrode CE1 and the second electrode CE2 of the storage capacitor Cst may be insulated from each other by the intervening second insulating layer 109.

The second electrode CE2 of the storage capacitor Cst may overlap the gate electrode 136 of the thin film transistor TFT, and the first electrode CE1 of the storage capacitor Cst and the gate electrode 136 of the thin film transistor TFT may be the same element. The first electrode CE1 of the storage capacitor Cst may be spaced apart from the gate electrode 136 of the thin film transistor TFT and arranged on the first insulating layer 107 as a separate and independent element.

The second electrode CE2 of the storage capacitor Cst may include Al, Pt, Pd, Ag, Mg, Au, Ni, Nd, Ir, Cr, Li, Ca, Mo, Ti, W, and/or Cu and may include a single layer or a multi-layer structure.

A third insulating layer 111 may be arranged on the second electrode CE2 of the storage capacitor Cst. The third insulating layer 111 may include at least one inorganic insulating material, such as at least one of $SiO_2$, $SiN_X$, $SiO_XN_Y$, $Al_2O_3$, $TiO_2$, $Ta_2O_5$, $HfO_2$, and ZnO. The third insulating layer 111 may include a single layer or a multi-layer structure.

The source electrode 137 and/or the drain electrode 138 may be arranged on the third insulating layer 111. The source electrode 137 and/or the drain electrode 138 may include a conductive material including at least one of Mo, Al, Cu, Ti, etc. and may include a multi-layer structure or a single layer. The source electrode 137 and/or the drain electrode 138 may have a multi-layered structure of Ti—Al—Ti.

The source electrode 137 and the drain electrode 138 may be electrically connected to the source region 132 and the drain region 133, respectively, through contact holes formed in the first insulating layer 107, the second insulating layer 109, and the third insulating layer 111.

A planarization layer 113 may be arranged on the source electrode 137 and the drain electrode 138. The planarization layer 113 may include a single layer or a multi-layer structure including an organic material and/or an inorganic material. The planarization layer 113 may include a general-purpose polymer such as benzocyclobutene (BCB), polyimide (PI), hexamethyldisiloxane (HMDSO), poly(methyl methacrylate) (PMMA), or polystyrene (PS), polymer derivatives having a phenol-based group, an acryl-based polymer, an imide-based polymer, an aryl-ether-based polymer, an amide-based polymer, a fluorine-based polymer, a p-xylene-based polymer, a vinyl-alcohol-based polymer, and/or a blend of some of the above materials. The planarization layer 113 may include $SiO_2$, $SiN_X$, SiON, $Al_2O_3$, $TiO_2$, $Ta_2O_5$, $HfO_2$, or ZnO. After the planarization layer 113 is formed, chemical mechanical polishing may be performed to provide a flat top surface.

Though not shown, the planarization layer 113 may have a multi-layered structure including a first planarization layer and a second planarization layer.

A display element 120 may be arranged on the planarization layer 113. The display element 120 may be an OLED. The display element 120 may include a pixel electrode 121, an intermediate layer 122, and an opposite electrode 123.

The pixel electrode 121 may be arranged on the planarization layer 113. The pixel electrode 121 may be a (semi-)transparent electrode or a reflective electrode. The pixel electrode 121 may include a reflective film including at least one of Al, Pt, Pd, Ag, Mg, Au, Ni, Nd, Ir, Cr, Li, Ca, Mo, Ti, W, Cu, and an alloy of some of the metals, and a transparent or semitransparent electrode layer on the reflective film. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 121 may have a structure in which ITO, Ag, and ITO layers are sequentially stacked.

A pixel-defining layer 117 may be arranged on the planarization layer 113, and the pixel-defining layer 117 may include an opening that exposes at least a portion of the pixel electrode 121. The opening of the pixel-defining layer 117 may be defined as an emission area of the selected from the group consisting. The periphery of the emission area is a non-emission area, and the non-emission area may at least partially surround the emission area. The display area DA (see FIG. 1) may include a plurality of emission areas and a non-emission area surrounding the emission areas. The pixel-defining layer 117 may increase a distance between the pixel electrode 121 and the opposite electrode 123, thereby preventing occurrence of an arc at an edge of the pixel electrode 121.

The pixel-defining layer 117 includes an organic insulating material such as at least one of polyimide, polyamide, acrylic resin, benzocyclobutene, hexamethyldisiloxane, and phenol resin, and may be formed by spin coating, or the like. A spacer (not shown) may be further arranged on the pixel-defining layer 117.

The intermediate layer 122 may be arranged on the exposed portion of the pixel electrode 121. The intermediate layer 122 may include a first functional layer, an emission layer (EML), and a second functional layer. The first functional layer and the second functional layer may be optional. The first functional layer may be arranged under the EML, and the second functional layer may be arranged over the EML. The first functional layer and the second functional layer may be organic functional layers.

The first functional layer may include a hole injection layer (HIL) and/or a hole transport layer (HTL), and the second functional layer may include an electron transport layer (ETL) and/or an electron injection layer (EIL).

The EML may include a fluorescent or phosphorous material emitting red, green, blue, or white light. The EML may include a low-molecular weight organic material or a polymer organic material.

When the EML includes a low-molecular weight material, the intermediate layer 122 may have a single-layered or multi-layered structure including an HIL, an HTL, an EML, an ETL, and an EIL. The intermediate layer 220 may include at least one of copper phthalocyanine (CuPc), N,N'-di(naphthalene-1-yl)-N,N'-diphenyl-benzidine (NPB), and tris-8-hydroxyquinoline aluminum (Alq3).

When the EML includes a polymer organic material, the intermediate layer 122 may have a structure including an HTL and an EML. The HTL may include PEDOT, and the EML may include a polymer material such as at least one of a poly-phenylene vinylene-based material and a polyfluoren-based material. The EML may be formed by screen printing, inkjet printing, laser induced thermal imaging (LITI), or the like.

The opposite electrode 123 may be arranged on the intermediate layer 122. The opposite electrode 123 may cover the entire intermediate layer 122. The opposite electrode 123 may substantially cover the entire display area DA. The opposite electrode 123 may be formed as one body over the entire display area DA to cover the pixels P using an open mask.

The opposite electrode 123 may include a conductive material having a small work function. For example, the opposite electrode 123 may include a (semi-) transparent layer including Ag, Mg, Al, Pt, Pd, Au, Ni, Nd, Ir, Cr, Li, Ca, or any alloy of some of the metals. The opposite electrode 123 may further include a layer such as ITO, IZO, ZnO, or $In_2O_3$ over the (semi-)transparent layer.

An encapsulation member 180 may be arranged on the display element 120. The encapsulation member 180 may be a thin-film encapsulation (TFE) layer. The encapsulation member 180 may include at least one inorganic layer and at least one organic layer. The encapsulation member 180 may include a first inorganic layer 181, an organic layer 182, and a second inorganic layer 183 which are sequentially stacked.

The first inorganic layer 181 and the second inorganic layer 183 may include at least one inorganic insulating material, such as at least one of $SiO_2$, $SiN_X$, $SiO_XN_Y$, $Al_2O_3$, $TiO_2$, $Ta_2O_5$, $HfO_2$, and ZnO. The organic layer 182 may include a polymer-based material, such as polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate, polyacrylic acid, etc.), or a combination of some of the above materials.

The first substrate 101 may include a polymer resin. For example, the first substrate 101 may include polyimide.

At least one wire 147 may be arranged on the buffer layer 105. The at least one wire 147 arranged on the buffer layer 105 may include at least one of the scan line SL (see FIG. 2), the emission control line EL (see FIG. 2), and the data line DL (see FIG. 2).

The at least one wire 147 arranged on the buffer layer 105, the first insulating layer 107, the second insulating layer 109, or the third insulating layer 111.

When/if the second substrate 103 includes a polymer resin (e.g., polyimide), polarization occurs in the polymer resin (e.g., polyimide) due to electrical signals applied to wires arranged on the second substrate 103, and thus transistor characteristics may change due to charges caused by the polarization. For example, due to the charges caused by the polarization that occurred on the second substrate 103, a time it takes for the thin film transistor TFT to be turned off may increase, and this may cause a bright spot in a displayed image.

When electrical signals (e.g., voltages or currents) are applied to the thin film transistor TFT and the wire 147 adjacent to the thin film transistor TFT in different directions, an electric field may be formed around the thin film transistor TFT and the wire 147. For example, when an electrical signal (e.g., voltage or current) is applied to the thin film transistor TFT in the first direction D1 (see FIG. 2) and an electrical signal (e.g., voltage or current) is applied to the wire 147 adjacent to the thin film transistor TFT in the second direction D2 (see FIG. 2) opposite to the first direction D1, an electric field may be formed around the thin film transistor TFT and the wire 147. An electrical signal (e.g., voltage or current) may be applied to the thin film transistor TFT in the third direction D3 (see FIG. 2), and an electrical signal (e.g., voltage or current) may be applied to the wire 147 adjacent to the thin film transistor TFT in the fourth direction D4 (see FIG. 2) opposite to the third direction D3. Various signal application directions are possible.

When/if the second substrate 103 includes a polymer resin (e.g., polyimide), different types of charges may be formed at an interface of the second substrate 103 adjacent to the thin film transistor TFT and an interface of the second substrate 103 adjacent to the wire 147 due to the electric fields formed around the thin film transistor TFT and the wire 147, and a dipole may be formed at the interfaces of the second substrate 103 due to the different types of charges formed at the interfaces of the second substrate 103. For example, due to the electric fields formed around the thin film transistor TFT and the wire 147, a negative charge may be formed at the interface of the second substrate 103 adjacent to the thin film transistor TFT, a positive charge may be formed at the interface of the second substrate 103 adjacent to the wire 147, and a dipole may be formed at the interfaces of the second substrate 103 due to the different types of charges formed at the interfaces of the second substrate 103. A positive charge may be formed at the interface of the second substrate 103 adjacent to the thin film transistor TFT, and a negative charge may be formed at the interface of the second substrate 103 adjacent to the wire 147. Various charges are possible.

A change in characteristics of the thin film transistor TFT may be caused by the dipole formed at the interfaces of the second substrate 103. For example, the dipole formed at the interfaces of the second substrate 103 may function as a capacitor so that the time it takes for the thin film transistor TFT to be turned off may increase, and this may cause a bright spot in a displayed image.

To maintain the characteristics of the TFT and to prevent the bright spot, the second substrate 103 may include an LLT material. The second substrate 103 may include a tin oxide including (doped with) an LLT material. The second substrate 103 may include an LLT material including (or doped with) tin.

The LLT material may have a melting point, liquidus temperature, or glass transition temperature that is less than 1,000° C., less than 700° C., in a range of about 500° C. to about 600° C., and/or less than 500° C.

The LLT material may be a glass (or glass material) and may include at least one of tin fluorophosphate glass, tungsten-doped tin fluorophosphate glass, boron phosphate glass, chalcogenide glass, tellurite glass, borate glass, phosphate glass, and a combination of some of the glasses.

The LLT material may include a tin oxide including (or doped with) a material such as tin fluorophosphate glass, tungsten-doped tin fluorophosphate glass, boron phosphate glass, chalcogenide glass, tellurite glass, borate glass, or phosphate glass.

The LLT material may be formed using at least one of stannous oxide (SnO), stannous fluoride ($SnF_2$), niobium pentoxide ($Nb_2O_5$), phosphorus pentoxide ($P_2O_5$), and boron phosphate ($BPO_4$), in the presence of oxygen. The LLT material may be formed through sputtering, vacuum deposition, low temperature deposition, plasma enhanced chemical vapor deposition (PCVD), plasma ion assisted deposition (PIAD), electron beam coating, or ion plating, in the presence of oxygen. By increasing the amount of oxygen during a deposition process, the ratio of tin oxide ($SnO_2$) included in the LLT material may be increased. The LLT material may include a $Sn^{2+}$-containing inorganic oxide such as SnO, $SnO+P_2O_5$—, or $SnO+BPO_4$.

The LLT material may include at least one of Tin (Sn), boron (B), phosphorus (P), and fluorine (F). The LLT material may include a material doped with (or including) at least one of B, P, and F on a Sn base. The LLT material may include Sn in a range of about 75 wt % to about 85 wt %. The melting point, liquidus temperature, or glass transition temperature of the LLT material may be increased or decreased by adjusting the concentration(s) of at least one of B, P, and F.

The LLT material may include an inorganic oxide. The LLT material may include an inorganic insulating material such as $SnO_2$, $SiO_2$, $SiN_x$, $SiO_xN_y$, $Al_2O_3$, $TiO_2$, $Ta_2O_5$, $HfO_2$, or ZnO.

The transparency of the second substrate 103 may be improved by adjusting the component ratio of elements included in the second substrate 103. The second substrate 103 may be substantially transparent.

The second substrate 103 includes an LLT material, and thus an unwanted change in the characteristics of thin film transistors TFT and/or unwanted bright spots in a displayed image may be prevented or minimized.

The second substrate 103 includes an LLT material, and thus the second substrate 103 may be formed and processed at a low temperature. Therefore, desirable processability of the display apparatus 1 may attained.

A thickness (e.g., a first thickness t1) of the second substrate 103 including the LLT material may be in a range of about 1 μm to about 2 μm, from an upper surface of the first barrier layer 102.

When/if the thickness (e.g., the first thickness t1) of the second substrate 103 is less than 1 μm, elements (e.g., a transistor or a display element) arranged on the second substrate 103 may be damaged due to penetration of foreign matter, moisture, or external air through the second substrate 103. When/if the thickness (e.g., the first thickness t1) of the second substrate 103 is greater than 2 μm, thus the second substrate 103 may be more likely to crack, and the display apparatus 1 may be less flexible.

Because the thickness t1 of the second substrate 103 is in a range of about 1 μm to about 2 μm, damage to the elements (e.g., a transistor or a display element) arranged on the second substrate 103 may be prevented or minimized, and the display apparatus 1 may be sufficiently flexible.

Figure 5:
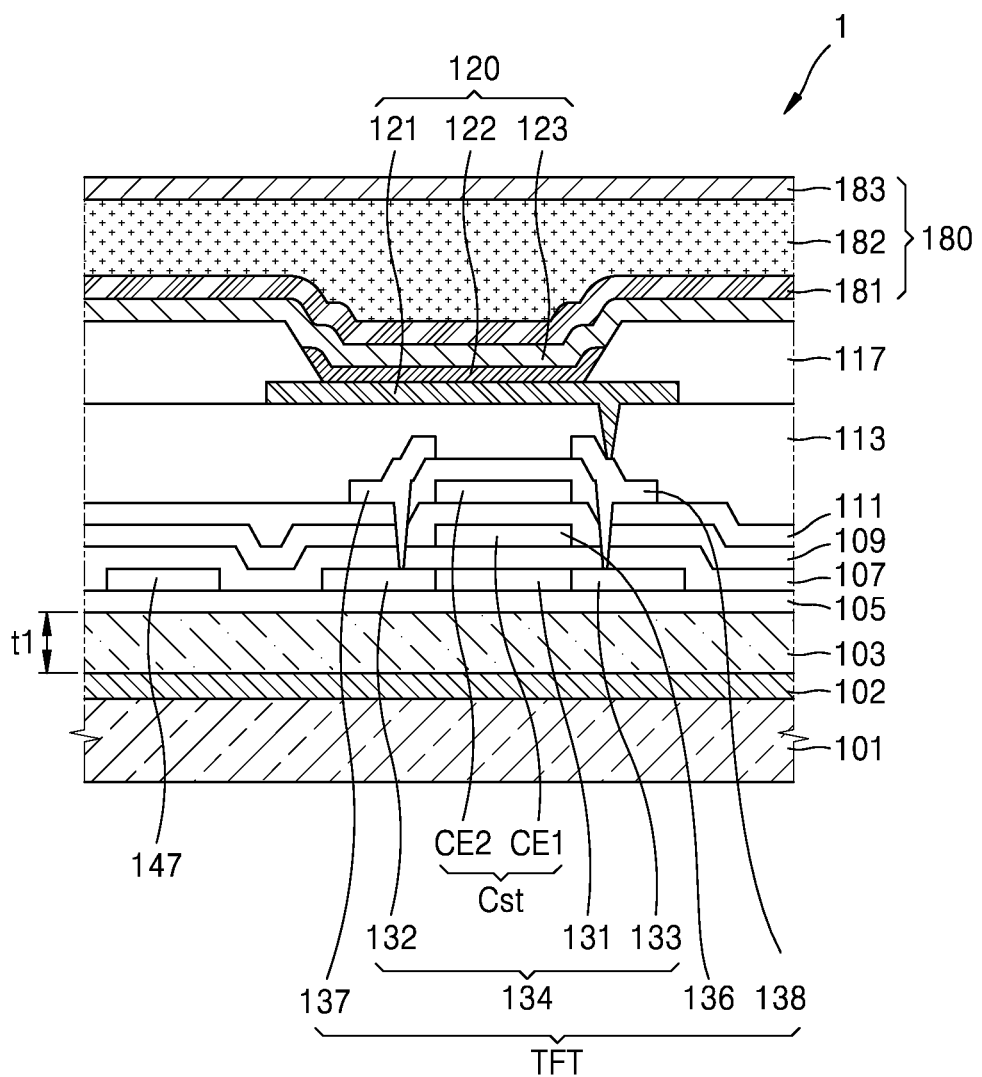
FIG. 5 is a schematic cross-sectional view of a display apparatus according to an embodiment.

FIG. 5 is a schematic cross-sectional view of a display apparatus 1 according to an embodiment. The display apparatus 1 illustrated in FIG. 5 is different from the display apparatus 1 illustrated in FIG. 4 in not including the second barrier layer 104 on the second substrate 103.

Referring to FIG. 5, The display apparatus 1 may include the first substrate 101, the first barrier layer 102, the second substrate 103, the thin film transistor TFT, the display element 120, and the encapsulation member 180.

The second substrate 103 may be arranged on the first substrate 101, and the first barrier layer 102 may be between the first substrate 101 and the second substrate 103. The first substrate 101 may include a polymer resin, e.g., polyimide, and the second substrate 103 may include an LLT material, e.g., a tin oxide including (or doped with) an LLT material.

The buffer layer 105 may be arranged directly on the second substrate 103. Because the second substrate 103 includes an inorganic material and because of the buffer layer 105, damage to the elements (e.g., a transistor or a display element) arranged on the second substrate 103 due to the penetration of foreign matter, moisture, or external air through the second substrate 103 may be prevented or minimized.

Because a total thickness of inorganic layers included in the display apparatus 1 is reduced, the flexibility of the display apparatus 1 may be improved.

The second substrate 103 shown in FIG. 5 may have the thickness t1 in a range of about 1 μm to 2 μm.

Figure 6:
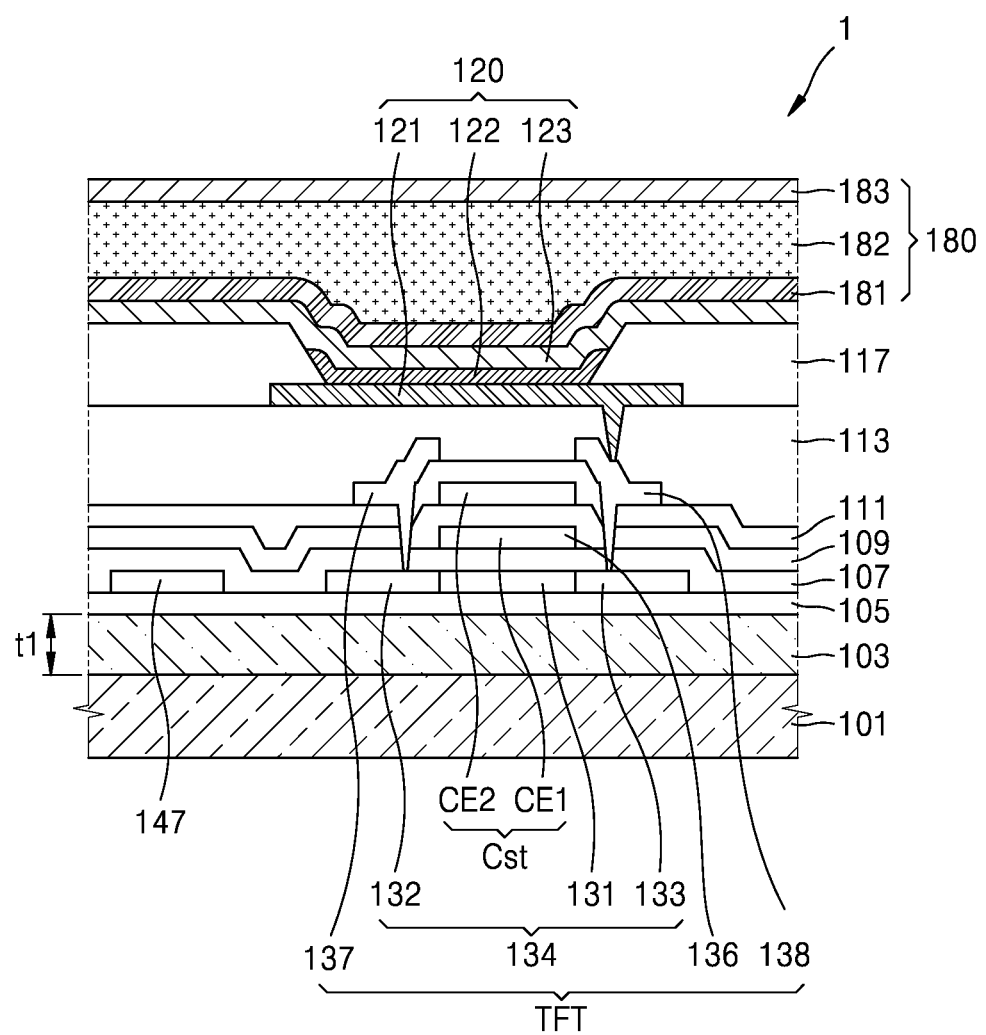
FIG. 6 is a schematic cross-sectional view of a display apparatus according to an embodiment.

FIG. 6 is a schematic cross-sectional view of a display apparatus 1 according to an embodiment. The display apparatus 1 of FIG. 6 is different from the display apparatus 1 of FIG. 4 in not including the first barrier layer 102 and the second barrier layer 104.

Referring to FIG. 6, The display apparatus 1 may include the first substrate 101, the second substrate 103, the thin film transistor TFT, the display element 120, and the encapsulation member 180.

The second substrate 103 may be arranged directly on the first substrate 101. The first substrate 101 may include a polymer resin, e.g., polyimide, and the second substrate 103 may include an LLT material, e.g., a tin oxide including (or doped with) an LLT material.

Because the second substrate 103 includes an inorganic material, even without the first barrier layer 102 and the second barrier layer 104, damage to the elements (e.g., a transistor or a display element) arranged on the second substrate 103 due to the penetration of foreign matter, moisture, or external air through the second substrate 103 may be prevented or minimized.

Because a total thickness of inorganic layers included in the display apparatus 1 is reduced, the flexibility of the display apparatus 1 may be improved.

The second substrate 103 shown in FIG. 6 may have the thickness t1 in a range of about 1 μm to 2 μm.

FIGS. 7 to 10 are schematic cross-sectional views of structures formed in a method of manufacturing a display apparatus according to one or more embodiments.

The method may include forming a second substrate 103 on a first substrate 101; forming, on the second substrate 103, a thin film transistor TFT including a semiconductor layer 134; forming a display element 120 on the thin film transistor TFT; and forming an encapsulation member 180 on the display element 120.

Figure 7:
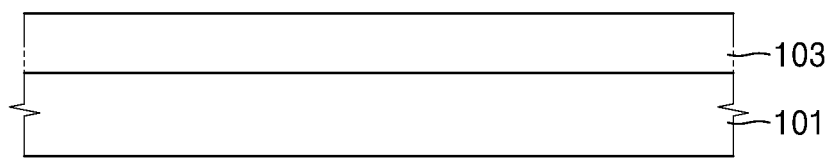
FIG. 7, FIG. 8, FIG. 9, and FIG. 10 are schematic cross-sectional views of structures formed in a method of manufacturing a display apparatus according to one or more embodiments.

Referring to FIG. 7, the second substrate 103 may be formed on the first substrate 101. The first substrate 101 and the second substrate 103 may include the materials described with reference to FIG. 4. For example, the first substrate 101 may include a polymer resin (e.g., polyimide), and the second substrate 103 may include an LLT material.

Figure 8:
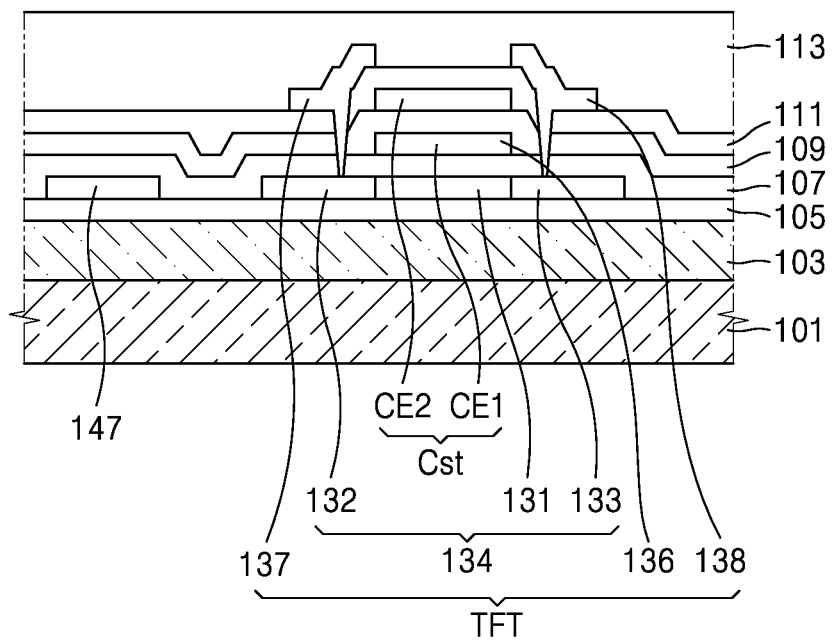

Referring to FIG. 8, after the forming of the second substrate 103 on the first substrate 101, the thin film transistor TFT may be formed on the second substrate 103.

The thin film transistor TFT, at least one wire 147, and a storage capacitor Cst may be formed on the second substrate 103.

A buffer layer 105, a first insulating layer 107, a second insulating layer 109, a third insulating layer 111, and a planarization layer 113 may be sequentially formed on the second substrate 103. The buffer layer 105, the first insulating layer 107, the second insulating layer 109, the third insulating layer 111, and the planarization layer 113 may include the materials described with reference to FIG. 4.

The thin film transistor TFT may include the semiconductor layer 134, a gate electrode 136, a source electrode 137, and a drain electrode 138. The storage capacitor Cst may include a first electrode CE1 and a second electrode CE2.

The semiconductor layer 134 may include a channel region 131, a source region 132, and a drain region 133, and may be arranged on the buffer layer 105. The gate electrode 136 may be formed on the first insulating layer 107, and the source electrode 137 and the drain electrode 138 may be formed on the third insulating layer 111.

The first electrode CE1 and the gate electrode 136 may be the same element, or the first electrode CE1 may be separate from the gate electrode 136. The first electrode CE1 may be formed on the first insulating layer 107, and the second electrode CE2 may be formed on the second insulating layer 109.

The thin film transistor TFT and the storage capacitor Cst may include the materials described with reference to FIG. 4.

At least one wire 147 may be formed on the buffer layer 105. The at least one wire 147 may include at least one of the scan line SL, the emission control line EL, and the data line DL which are described with reference to FIG. 2. The at least one wire 147 may formed on the buffer layer 105, the first insulating layer 107, the second insulating layer 109, and/or the third insulating layer 111.

Figure 9:
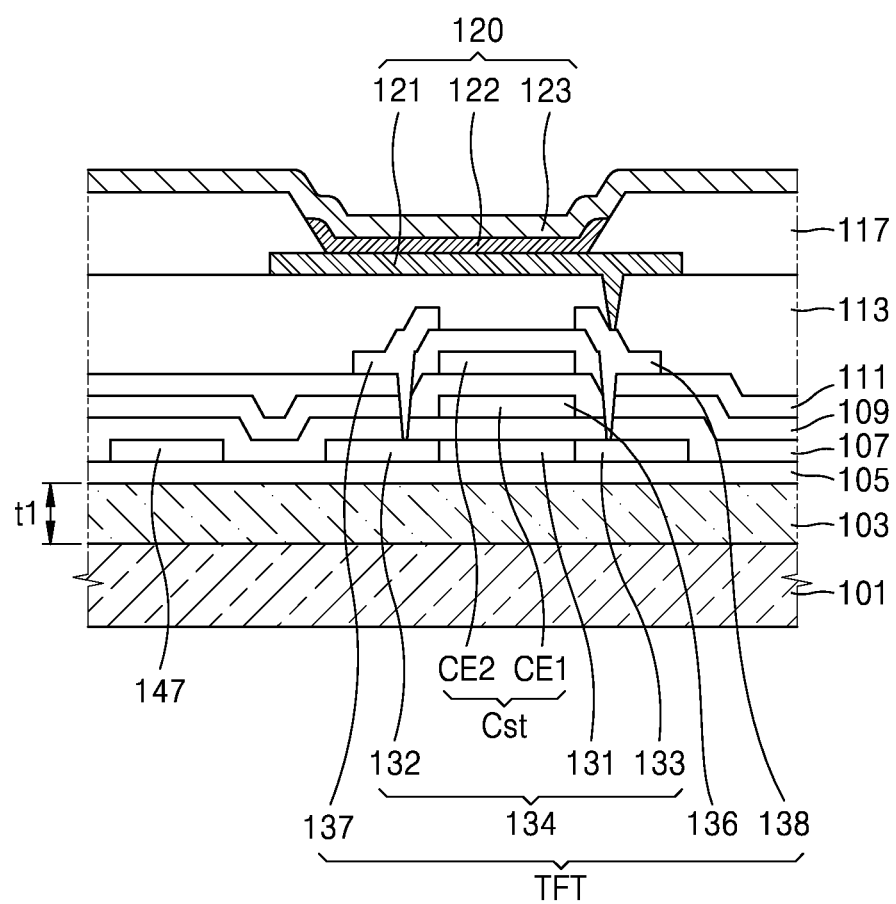

Referring to FIG. 9, after the forming of the thin film transistor TFT on the second substrate 103, the display element 120 may be formed on the thin film transistor TFT.

The display element 120 may be an OLED. The display element 120 may include a pixel electrode 121, an intermediate layer 122, and an opposite electrode 123.

The pixel electrode 121 may be arranged on the planarization layer 113. The pixel electrode 121 may include the material described with reference to FIG. 4. The pixel-defining layer 117 may be arranged on the planarization layer 113. The pixel-defining layer 117 may include an opening that exposes at least a portion of the pixel electrode 121.

The intermediate layer 122 may be arranged on the exposed portion of the pixel electrode 121. The intermediate layer 122 may include a first functional layer, an emission layer, and a second functional layer. The opposite electrode 123 may be arranged on the intermediate layer 122.

Figure 10:
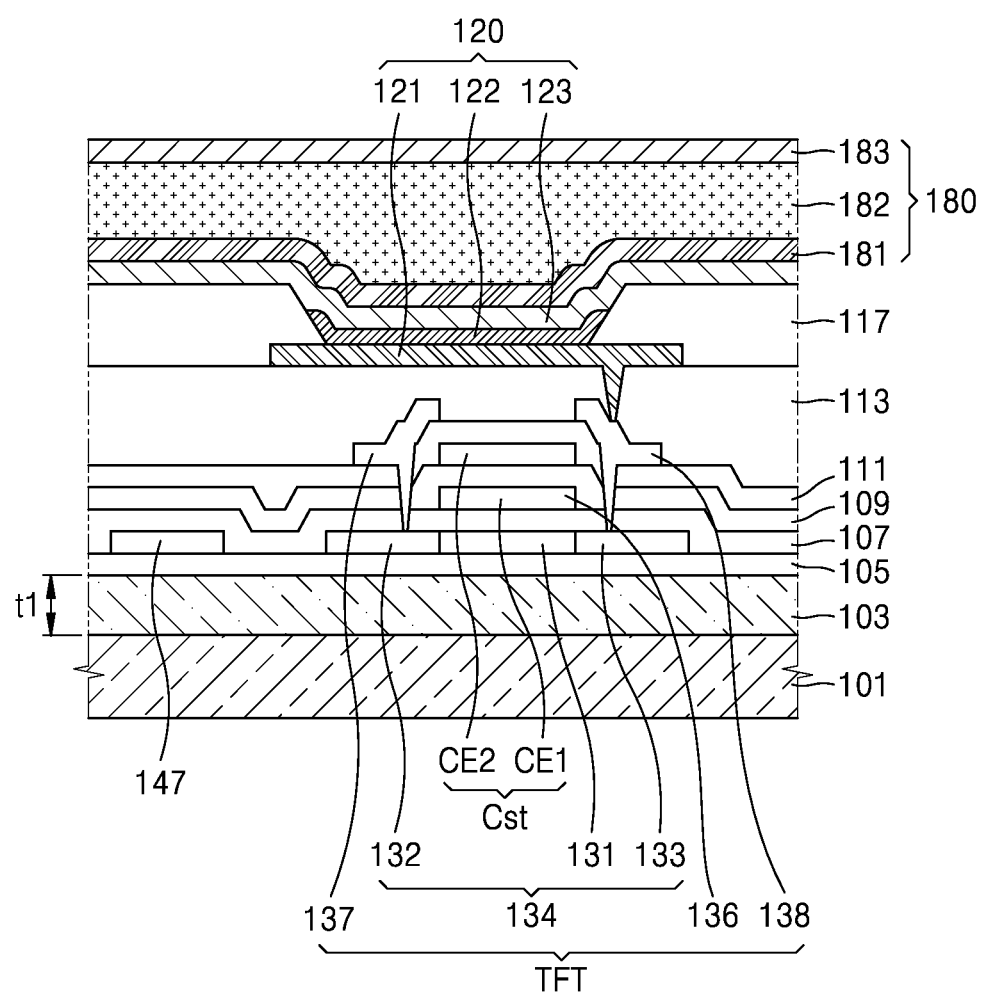

Referring to FIG. 10, after the forming of the display element 120 on the thin film transistor TFT, the encapsulation member 180 may be formed on the display element 120.

The encapsulation member 180 may include a thin-film encapsulation (TFE) layer. The encapsulation member 180 may include at least one inorganic layer and at least one organic layer. The encapsulation member 180 may include a first inorganic layer 181, an organic layer 182, and a second inorganic layer 183 which are sequentially stacked.

The first inorganic layer 181, the organic layer 182, and the second inorganic layer 183 may include the materials described with reference to FIG. 4.

Referring to FIGS. 7 to 10, the display apparatus may include the first substrate 101, the second substrate 103, the thin film transistor TFT, the display element 120, and the encapsulation member 180. The second substrate 103 may be arranged directly on the first substrate 101, and the buffer layer 105 may be arranged directly on the second substrate 103. The thin film transistor TFT, the display element 120, and the encapsulation member 180 may be formed on the second substrate 103.

Figure 11:
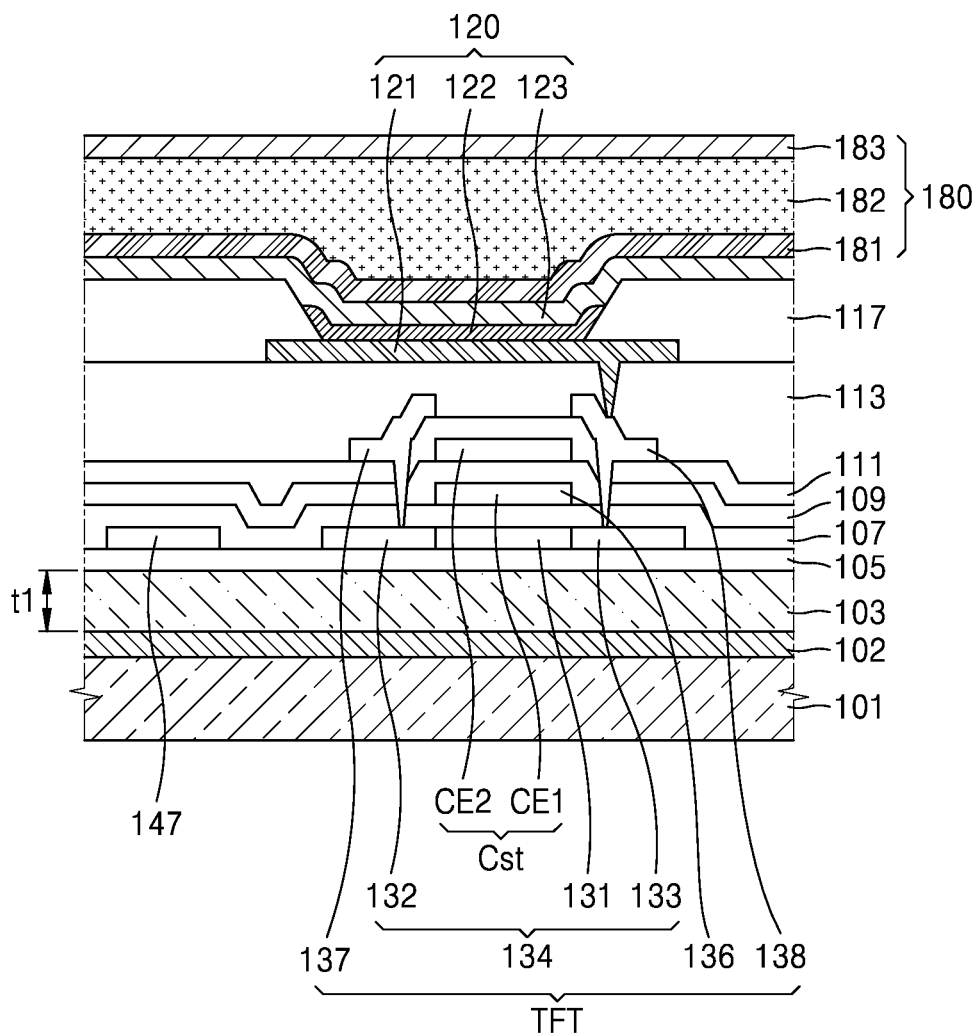
FIG. 11 is a schematic cross-sectional view of a structure formed in a method of manufacturing a display apparatus according to an embodiment.

FIG. 11 is a schematic cross-sectional view of a structure formed in a method of manufacturing a display apparatus according to an embodiment. The structure of FIG. 11 is different from the structures of FIGS. 7 to 10 in forming of a first barrier layer 102 on the first substrate 101 before the forming of the second substrate 103.

Referring to FIG. 11, before the forming of the second substrate 103, the first barrier layer 102 may be formed on the first substrate 101.

After the first barrier layer 102 is formed on the first substrate 101, the second substrate 103 may be formed on the first barrier layer 102. Accordingly, the display apparatus may have the sequentially stacked first substrate 101, first barrier layer 102, second substrate 103, and buffer layer 105.

The method may include forming the first barrier layer 102 on the first substrate 101, forming the second substrate 103 on the first barrier layer 102, forming the thin film transistor TFT on the second substrate 103, forming the display element 120 on the thin film transistor TFT, and forming the encapsulation member 180 on the display element 120.

Figure 12:
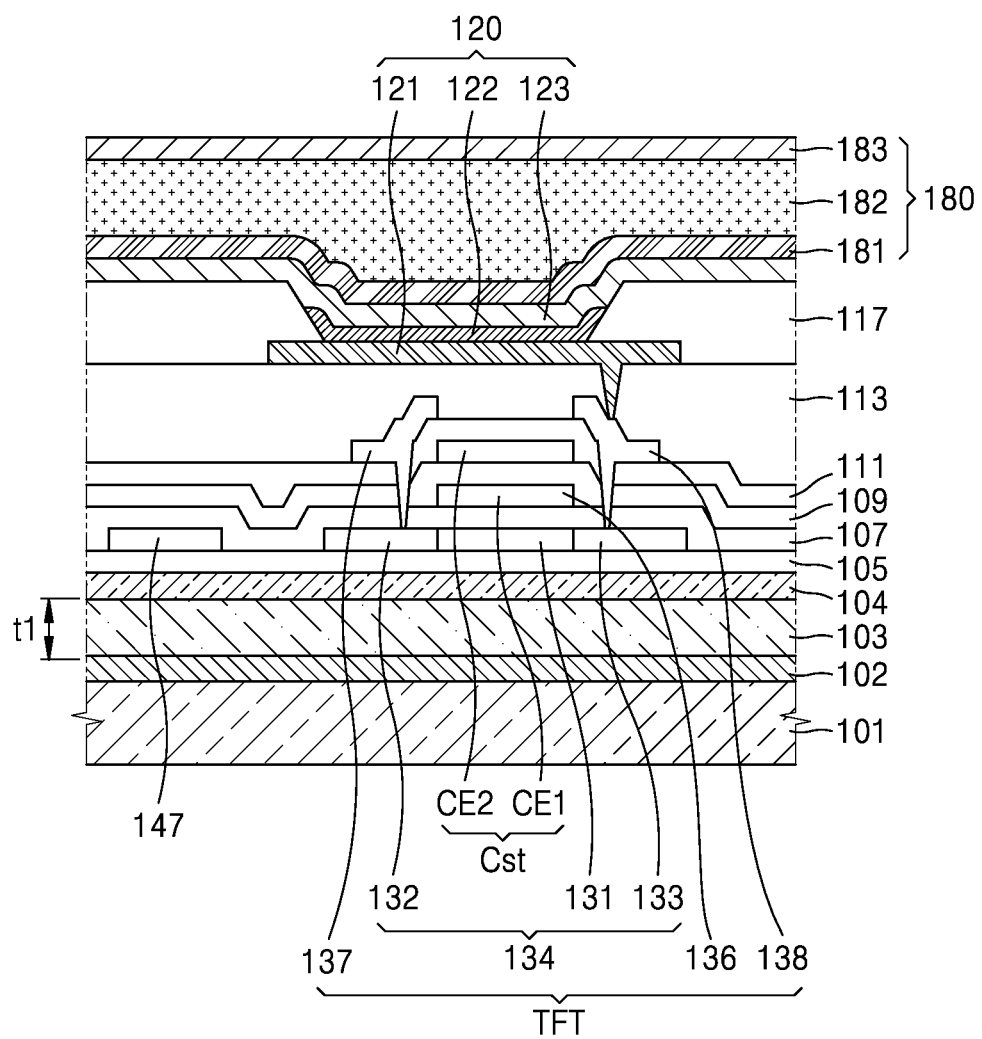
FIG. 12 is a schematic cross-sectional view of a structure formed in a method of manufacturing a display apparatus, according to an embodiment.

FIG. 12 is a schematic cross-sectional view of a structure formed in a method of manufacturing a display apparatus according to an embodiment. The structure of FIG. 12 is different from the structures of FIG. 11 in forming of a second barrier layer 104 on the second substrate 103 before the forming of the thin film transistor TFT on the second substrate 103.

Referring to FIG. 12, before the forming of the thin film transistor TFT on the second substrate 103, the second barrier layer 104 may be formed on the second substrate 103.

After the second substrate 103 is formed on the first barrier layer 102, the second barrier layer 104 may be formed on the second substrate 103. Accordingly, the display apparatus may have the sequentially stacked first substrate 101, first barrier layer 102, second substrate 103, second barrier layer 104, and buffer layer 105.

The method may include forming the first barrier layer 102 on the first substrate 101, forming the second substrate 103 on the first barrier layer 102, forming the second barrier layer 104 on the second substrate 103, forming the thin film transistor TFT on the second barrier layer 104, forming the display element 120 on the thin film transistor TFT, and forming the encapsulation member 180 on the display element 120.

According to embodiments, with a substrate including an LLT material, a display apparatus may have satisfactory flexibility, reliability, and processability.

The described example embodiments should be considered illustrative and not for purposes of limitation. Descriptions of features or aspects within each embodiment should typically available for other similar features or aspects in other embodiments. Various changes in form and details may be made in the example embodiments without departing from the scope of the claims.

What is claimed is:

1. A display apparatus comprising:
    a first substrate including a polymer resin;
    a transistor overlapping the first substrate; and
    a second substrate arranged between the first substrate and the transistor and including a glass material, wherein a liquidus temperature of the glass material is less than 1000° C.

2. The display apparatus of claim 1, wherein the second substrate is formed of an inorganic oxide.

3. The display apparatus of claim 2, wherein the second substrate is formed of a tin oxide that is doped with the glass material.

4. The display apparatus of claim 3, wherein the second substrate includes at least one of tin, boron, phosphorus, and fluorine.

5. The display apparatus of claim 1, further comprising a display element arranged on the transistor.

6. The display apparatus of claim 5, further comprising an encapsulation member arranged on the display element.

7. The display apparatus of claim 6, wherein the encapsulation member includes at least one inorganic layer and at least one organic layer.

8. The display apparatus of claim 1, further comprising a first barrier layer between the first substrate and the second substrate.

9. The display apparatus of claim 8, further comprising a buffer layer between the second substrate and the transistor, wherein the semiconductor layer is arranged directly on the buffer layer.

10. The display apparatus of claim 9, further comprising a second barrier layer between the second substrate and the buffer layer.

11. A method of manufacturing a display apparatus, the method comprising:
    preparing a first substrate;
    forming a second substrate on the first substrate, wherein the second substrate includes a glass material, and wherein a liquidus temperature of the glass material is less than 1000° C.; and
    forming a transistor on the second substrate, wherein the transistor includes a semiconductor layer, and wherein the second substrate is positioned between the first substrate and the transistor.

12. The method of claim 11, wherein the first substrate includes a polymer resin.

13. The method of claim 11, wherein the second substrate is formed of an inorganic oxide.

14. The method of claim 13, wherein the second substrate is formed of a tin oxide that is doped with the glass material.

15. The method of claim 14, wherein the second substrate includes at least one of tin, boron, phosphorus, and fluorine.

16. The method of claim 11, further comprising forming a display element on the transistor.

17. The method of claim 16, further comprising forming an encapsulation member on the display element.

18. The method of claim 17, wherein the encapsulation member includes at least one inorganic layer and at least one organic layer.

19. The method of claim 16, further comprising, before the forming of the second substrate on the first substrate, forming a first barrier layer on the first substrate.

20. The method of claim 19, further comprising, before the forming of the transistor on the second substrate, forming a second barrier layer on the second substrate.

* * * * *